(12) United States Patent
Goin et al.

(10) Patent No.: US 6,536,872 B2
(45) Date of Patent: Mar. 25, 2003

(54) CONNECTION MODULE

(75) Inventors: Richard Louis Goin, Lexington, KY (US); Steven Robert Komplin, Lexington, KY (US); Brian David Smith, Lexington, KY (US); Brandon Sung-Hwan Song, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/930,767

(22) Filed: Aug. 16, 2001

(65) Prior Publication Data

US 2003/0035026 A1 Feb. 20, 2003

(51) Int. Cl.[7] .................................................. B41J 2/01
(52) U.S. Cl. ........................................ 347/50; 439/67
(58) Field of Search ...................... 347/49, 50; 439/66, 439/67; 29/830, 842

(56) References Cited

U.S. PATENT DOCUMENTS

| | | |
|---|---|---|
| 3,356,983 A | 12/1967 | Johnson, Jr. |
| 4,466,184 A | 8/1984 | Cuneo et al. ................. 29/830 |
| 5,133,119 A | 7/1992 | Afshari et al. ................. 29/842 |
| 5,372,512 A | 12/1994 | Wilson et al. ................. 439/67 |
| 5,461,482 A | 10/1995 | Wilson et al. ................. 437/50 |
| 5,515,086 A | 5/1996 | Kakizaki et al. ................. 347/50 |
| 5,598,194 A * | 1/1997 | Hall et al. ..................... 347/50 |
| 5,608,434 A | 3/1997 | Wilson et al. ................. 347/50 |
| 5,759,047 A | 6/1998 | Brodsky et al. ............... 439/66 |
| 5,801,728 A | 9/1998 | Yanagi et al. ................. 347/50 |
| 5,984,691 A | 11/1999 | Brodsky et al. ............... 439/66 |

* cited by examiner

*Primary Examiner*—Anh T. N. Vo
(74) *Attorney, Agent, or Firm*—Taylor & Aust, P.C.; Scott N. Barker; Jacqueline Daspit

(57) ABSTRACT

A connection module including a base including a forward set of points located in a forward plane and a rearward set of points located in a rearward plane, the forward and rearward planes defining a junction therebetween. The connection module further includes a cable including a plurality of contacts located thereon, each contact being shaped and located to engage one of the points. The connection module has a backing element including a piece of sheet-like material, a set of contact protrusions on the piece of material, and at least one stiffening element on the piece of material. Each of the contact protrusions is shaped and located to engage the cable and urge one of the contacts into engagement with one of the points. The stiffening element is generally aligned with the junction when the contact protrusions engage the cable and urge the contacts into engagement with one of the points.

37 Claims, 14 Drawing Sheets

CONNECTION MODULE

The present invention is directed to a module for connecting electrical contacts.

BACKGROUND OF THE INVENTION

In business machines having control electronics, such as printers, fax machines, copiers and the like, a connection module may be used to complete connections between various components of the business machine. For example, a printer may include a printhead that reciprocates across the width of a sheet of paper to print indicia on the paper. The business machine may have a connection module that connects a central controller to the printhead so that the controller can control printing operations of, and receive feedback from, the printhead.

The connection module may include a flexible cable that is coupled to the controller at one end and the printhead at the other end. The printhead may have a plurality of contact points, and the cable may have a plurality of contacts for contacting the plurality of contact points on the printhead to thereby connect the controller and the printhead.

The connection module may include a backing element to urge the contacts of the cable into engagement with the contact points of the printhead. However, the contact points on the printhead may not always be co-planar, and existing backing elements may not be able to acceptably accommodate such non-planar contact points. Furthermore, existing backing elements may not provide sufficient connections between the contact and contact points, or sufficiently robust connections between the contacts and contact points.

SUMMARY OF THE INVENTION

The present invention is a connection module having a backing element that provides robust connections, and that can accommodate contact points on a printer printhead or other body that are not co-planar. In one embodiment the invention is a connection module including a base including a forward set of points located in a forward plane and a rearward set of points located in a rearward plane, the forward and rearward planes defining a junction therebetween. The connection module further includes a cable including a plurality of contacts located thereon, each contact being shaped and located to engage one of the points. The connection module has a backing element including a piece of sheet-like material, a set of contact protrusions on the piece of material, and at least one stiffening element on the piece of material. Each of the contact protrusions is shaped and located to engage the cable and urge one of the contacts into engagement with one of the points. The stiffening element is generally aligned with the junction when the contact protrusions engage the cable and urge the contacts into engagement with one of the points.

Other objects and advantages of the present invention will be apparent from the following description and the accompanying drawings.

DETAILED DESCRIPTION

Figure 1:
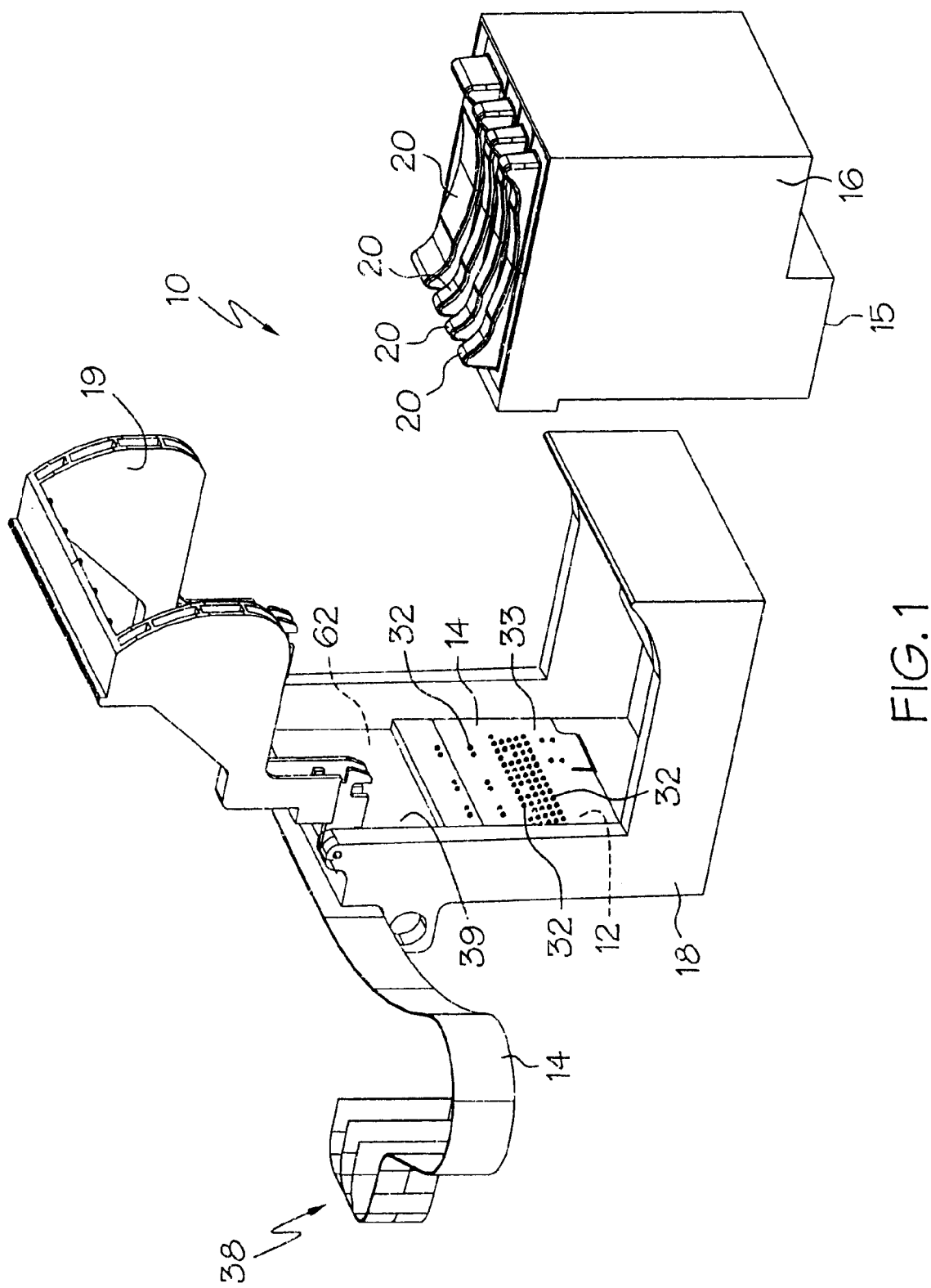
FIG. 1 is a front perspective, partially exploded view of a carriage, printhead and cable.
Figure 3:
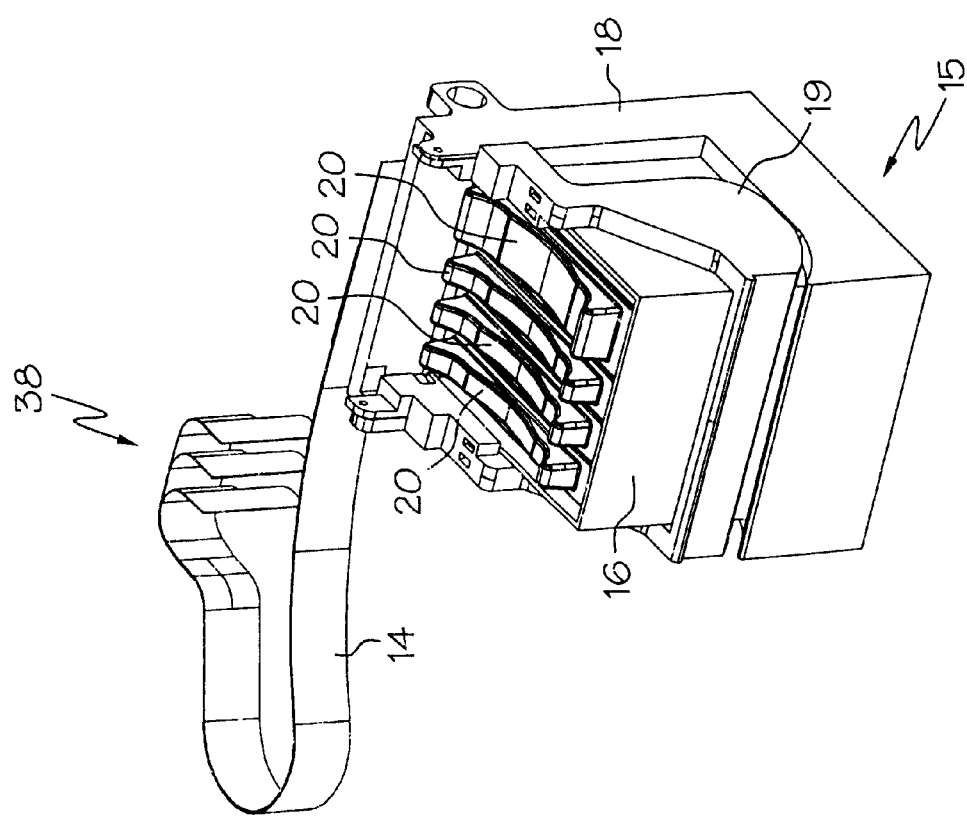
FIG. 3 is a perspective view of the printhead of FIG. 1 mounted inside the carriage of FIG. 1.

As shown in FIG. 1, a printer or other business machine may include a carriage 18 that can reciprocate across the width of the paper or other media (not shown) received in the printer or business machine. The carriage 18 is typically laterally movable along a track in the printer, and removably receives a base or printhead 16 therein to carry the printhead 16 to the various positions such that the printhead 16 can eject ink onto the media. The carriage 18 includes a pivotable retaining arm 19. When the printhead 16 is located inside the carriage 18, the retaining arm 19 can be pivoted and latched in its closed condition to retain the printhead 16 in the carriage (see FIG. 3). In the illustrated embodiment, the printhead 16 removably receives a set of ink tanks 20 therein, and the printhead includes a set of nozzles (not shown) on its lower surface 15 for ejecting ink from the ink tanks 20 and onto the media.

The carriage 18 also receives the carriage end 39 of a flexible cable 14 along a back surface 62 of the carriage 18, and the cable 14 is shaped and located to be coupled to the printhead 16 when the printhead 16 is received in the carriage. The cable 14 includes a connection end 38 that is coupled to a central CPU, controller or processor (not shown). The controller thereby provides inputs to, and receives outputs from, the printhead 16 via the cable 14.

Figure 1A:
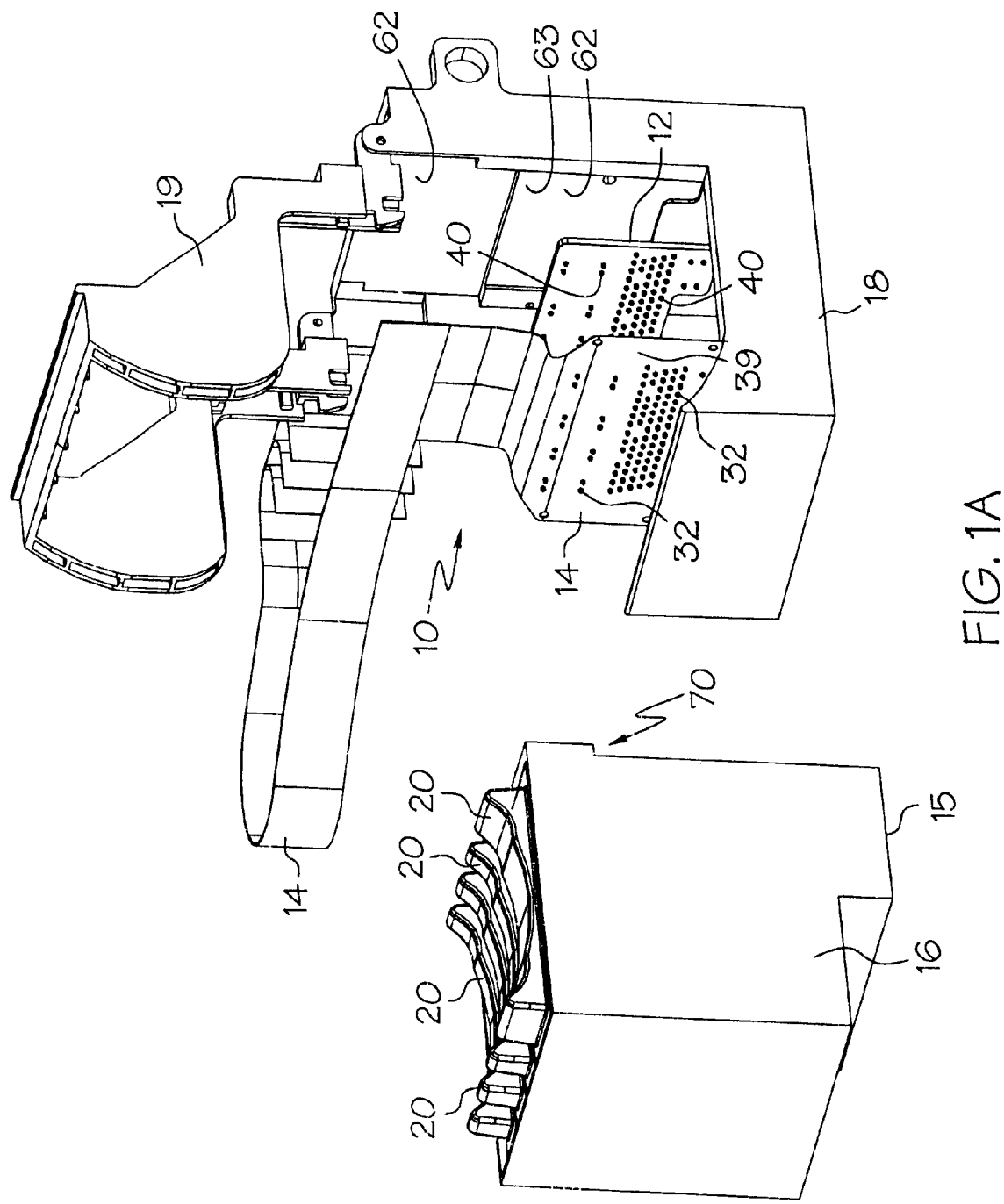
FIG. 1A is an exploded perspective view of the printhead and cable of FIG. 1, and a backing element.
Figure 2:
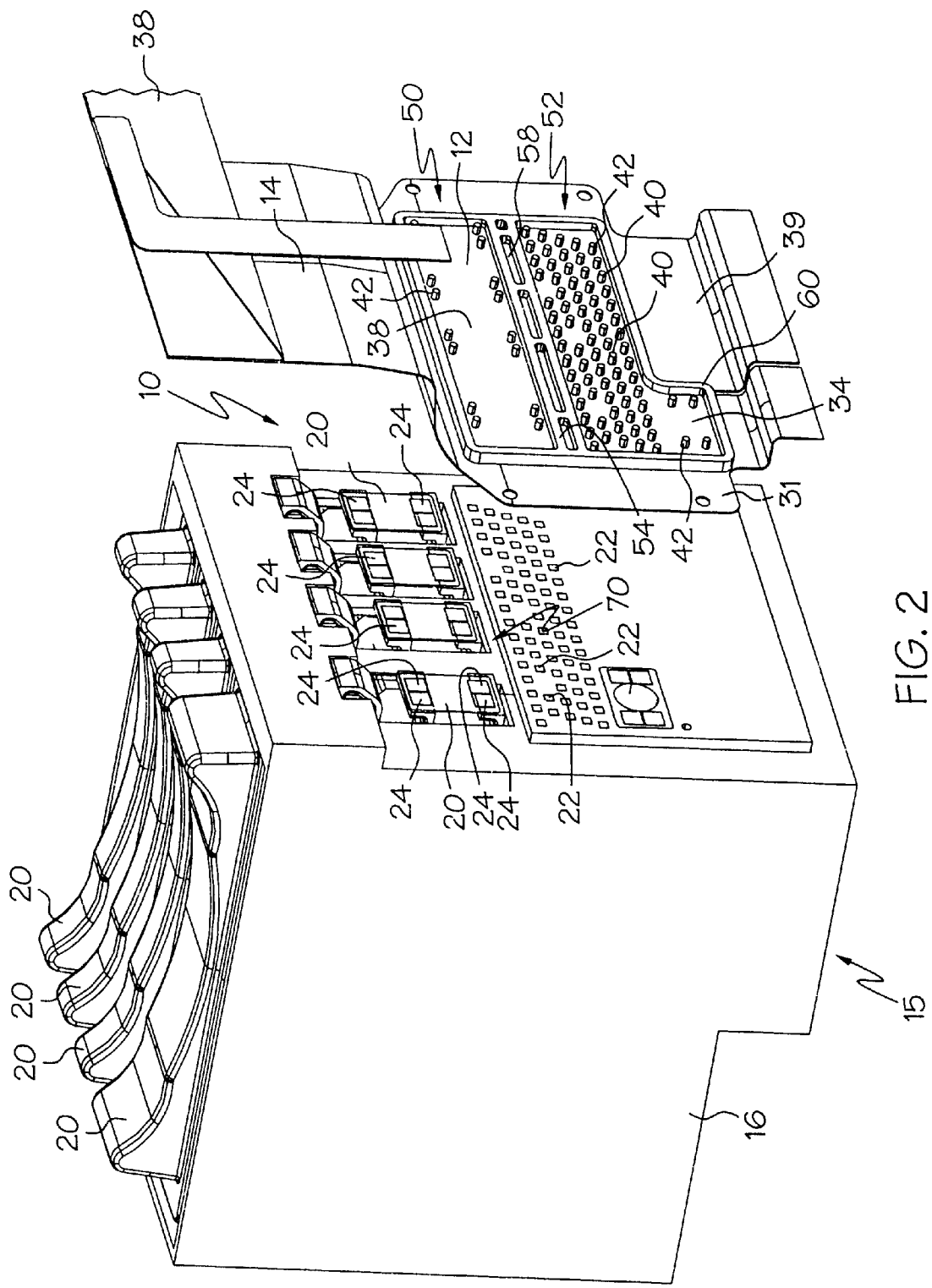
FIG. 2 is a rear perspective view of the printhead, cable and backing element of FIG. 1A.
Figure 4:
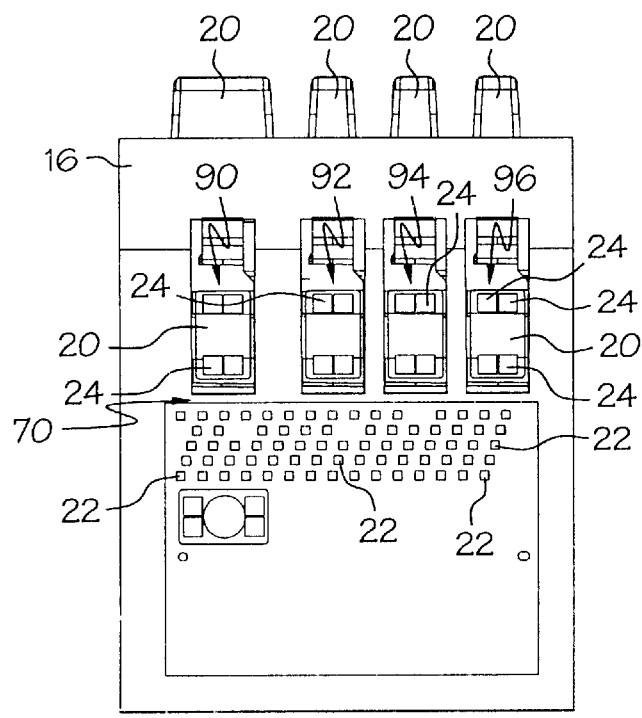
FIG. 4 is a rear view of the printhead of FIG. 2.

As shown in FIG. 1A, the connection module 10 of the present invention includes a backing element 12 located between the back surface 62 of the carriage 18 and the cable 14 to promote good electrical connections between the cable 14 and the printhead 16. For example, as shown in FIGS. 2 and 4, each ink tank 20 may have a set of four contact points 24 such that the printhead 16 has a plurality of conductive ink tank contact points 24 or upper contact points 24 on a rear surface of the printhead 16. In the illustrated embodiment, four ink tanks 20, each having four contact points 24 (for a total of sixteen upper contact points) are shown. Each of the ink tank contact points 24 can be electrically coupled to the controller via the cable 14 such that signals (i.e., a low level of ink in the ink tanks 20) can be sent to the controller.

The printhead 16 may also have a plurality of conductive printhead contact points 22 or lower contact points 22 located adjacent to the ink tank contact points 24. Each of the printhead contact points 22 can be electrically coupled to the controller such that signals or instructions (i.e., to control or activate ejection of ink from the printhead 16) can be sent to the printhead 16 via the cable 14 and the printhead contact points 22.

Figure 5:
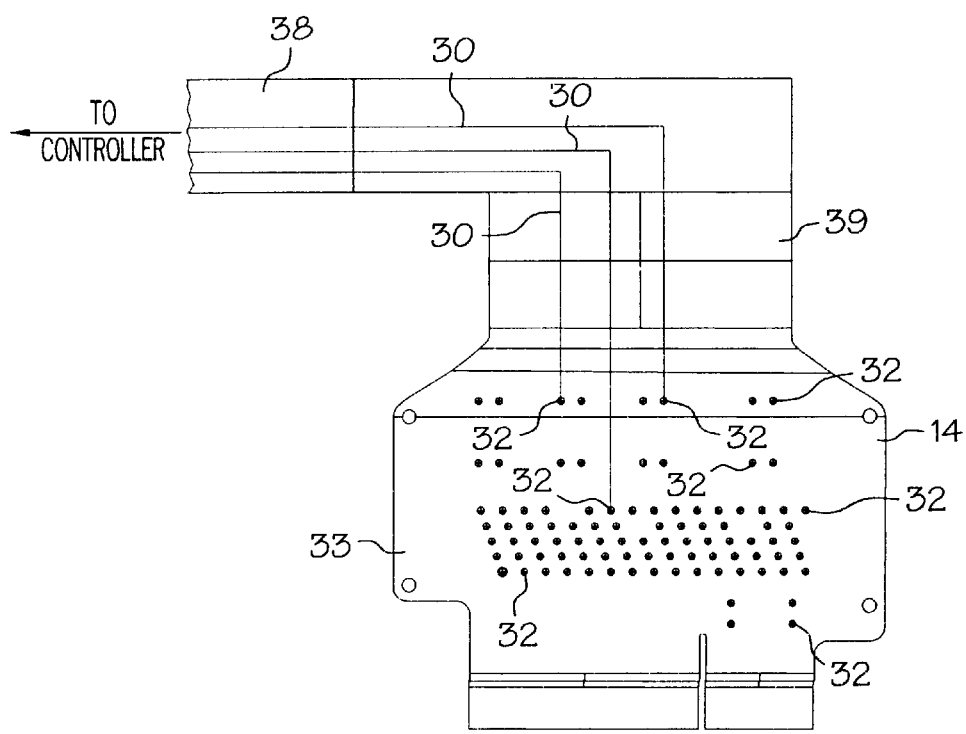
FIG. 5 is a front view of the cable of FIG. 1A.

As shown in FIG. 5, the cable 14 may be a thin flexible cable having a series of internal wires 30, each wire 30 being coupled to a conductive contact 32 on a lower end 33 of the cable 14 (only three wires are shown in FIG. 5 for illustrative purposes). Each contact 32 may be made of a wide variety of materials and formed into various shapes. For example, in one embodiment each contact 32 may be a gold-plated hemispherical bump. As noted earlier, the connection end 38 of the cable 14 can be coupled to the controller such that the controller is connected to each internal wire 30.

Figure 6:
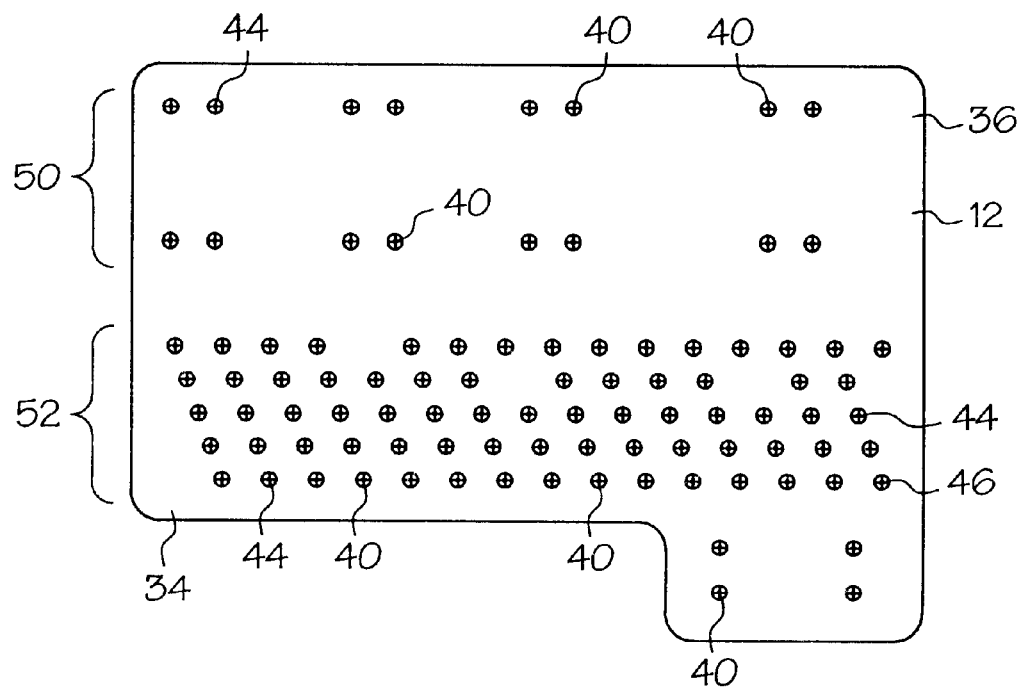
FIG. 6 is a front view of the backing element of FIG. 1A.
Figure 7:
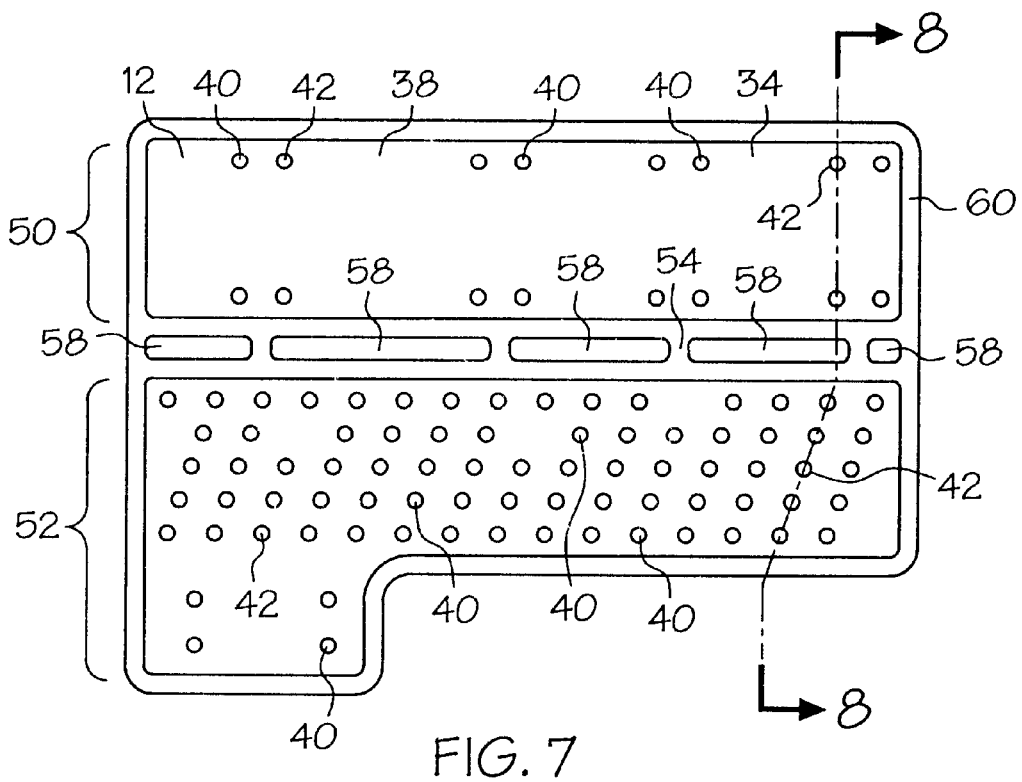
FIG. 7 is a rear view of the backing element of FIG. 6.
Figure 8:
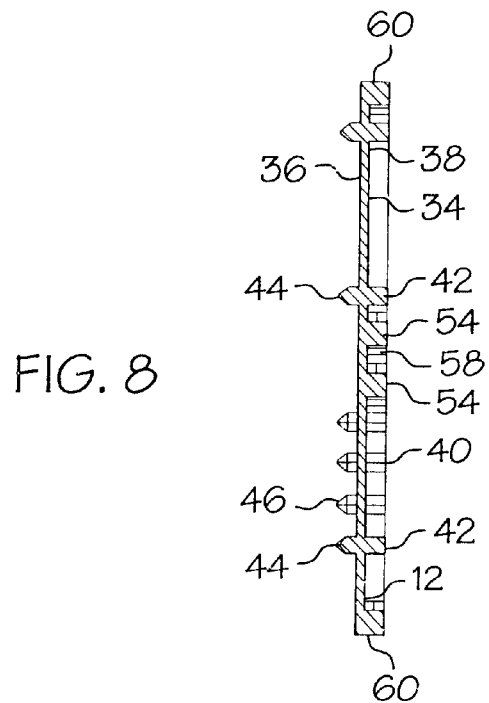
FIG. 8 is a side cross section taken along line 8—8 of the backing element of FIG. 7.

The backing element 12 may be used to ensure proper electrical connections between the flexible cable 14 and the printhead 16. As shown in FIGS. 6–8, the backing element 12 may include a piece of flexible or pliable sheet-like material 34, such as rubber or a rubber-like material, although other materials such as thermoplastic elastomers, foam, and the like may be used without departing from the scope of the invention. The piece of sheet-like material 34 includes a forward surface or front side 36, a rearward surface or back side 38 and a set of contact protrusions 40 located on the piece of material 34 and arranged in rows that extend across the width of the backing element 12.

Each contact protrusion 40 may include a rearwardly extending portion 42 that extends outwardly from the back side 38 of the sheet-like material 34 and a forwardly extending portion 44 that extends outwardly from the front side 36 of the sheet-like material 34 (see FIG. 8). Each rearwardly extending portion 42 may be generally cylindrical and each forwardly extending portion 44 may be generally cylindrical and include a generally cone-shaped tip 46. However, the forwardly and rearwardly extending portions 42, 44 of the contact protrusions 40 may assume a variety of other shapes, such as protrusions having square cross sections, protrusions having hemispherical, flat, or pyramidal tips, etc.

As best shown in FIGS. 6 and 7, the contact protrusions 40 can be divided into a set of upper contact protrusions 50 and a set of lower contact protrusions 52. The backing element 12 includes a stiffening element, rib or support protrusion 54 (FIG. 7) located on the back side 38 of the backing element 12 and extending between the upper 50 and lower 52 sets of contact protrusions. As shown in FIG. 7, the rib 54 may include a set of generally rectangular recesses 58 formed in the rib 54. The recesses 58 primarily serve to aid in manufacturing the backing element 12, for example to increase cooling of the backing element 12 when it is molded. However, the rib 54 may lack the recesses 58 and/or can assume a variety of shapes, such as a series of small, shorter ribs or protrusions, pegs, rows of bullets, or a single, long rib without the recesses 58, or nearly any other shape or components which increases the stiffness of the backing element 12 at the desired location.

The backing element 12 includes an outer lip 60 that extends outwardly from the back side 38 and around the outer perimeter of the backing element 12. The backing element 12 may be sized to be closely received in the carriage 18 to maintain the backing element 12 in the desired location (i.e., by an interference fit) or any other means of attachment, including but not limited to glues, adhesives, mechanical trapping elements, etc. The back surface 62 of the carriage 18 may include a rigid plate portion 63 (see FIGS. 1A, 9 and 10) to provide stiffness to the back side of the backing element 12. The rearwardly extending portions 42 of the contact protrusions 40, rib 54 and outer lip 60 all preferably extend outwardly from the piece of sheet-like material 34 about the same distance (in one embodiment, about 1 mm). The entire backing element 12 may be made from a single piece of material, preferably a pliable material, such as rubber.

Figure 9:
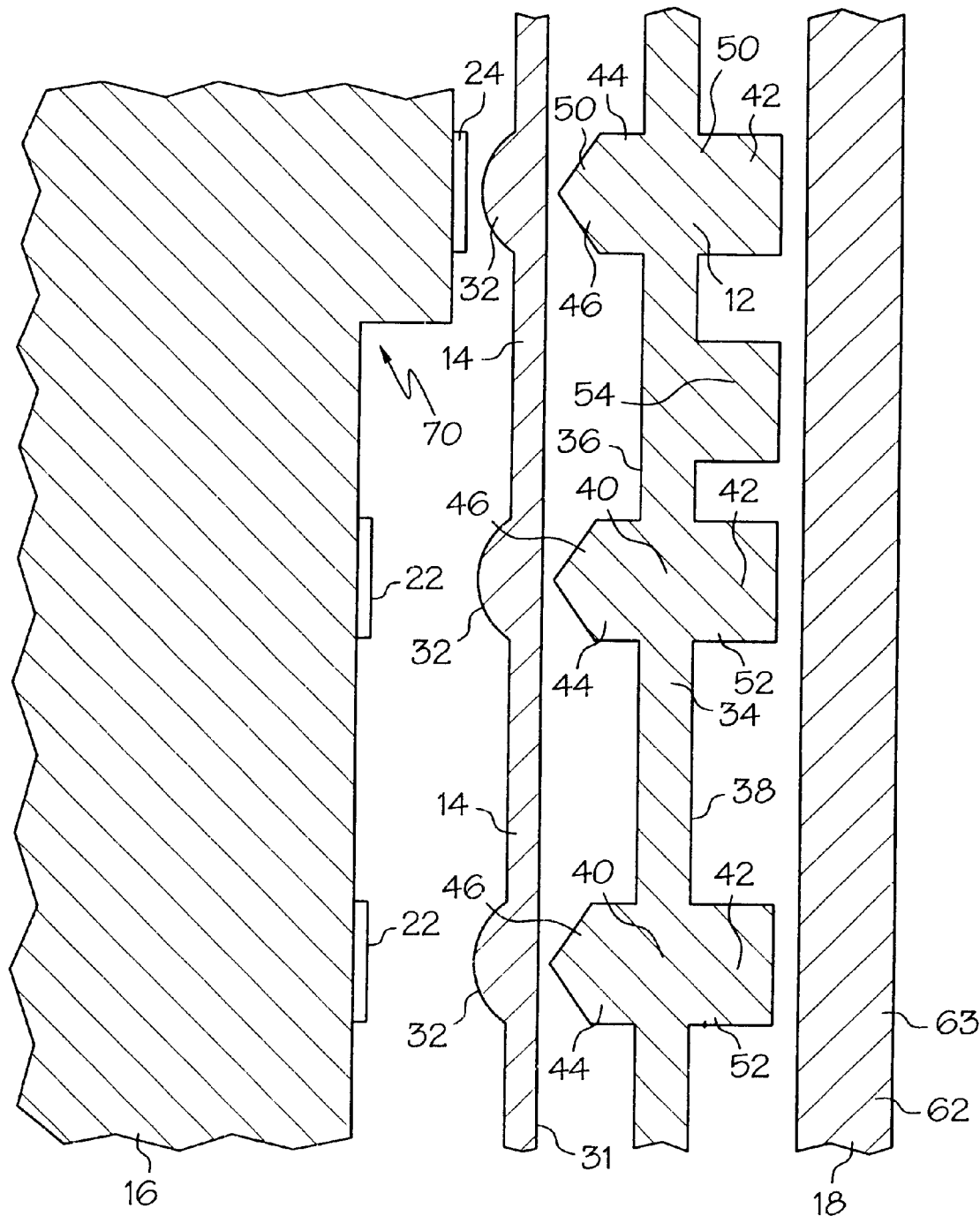
FIG. 9 is a detail side cross section of the connection module of the present invention, shown in its unclamped condition.

As shown in FIG. 9, the ink tank contact points 24 may not be aligned with the printhead contact points 22. In other words, the ink tank contact points 24 may be in a vertical plane that is offset from the printhead contacts points 22, or may be angled with respect to the printhead contact points 22. In this case a generally horizontally-extending junction 70 extends between the sets of contact points 22, 24. For example, because the ink tanks 20 are removably received in the printhead 16, the ink tanks 20 may not be received in the printhead 16 in a consistent position, and therefore the ink tank contact points 24 may not consistently be aligned with the printhead contact points 22.

In order to electrically couple the cable 14 to the printhead 16, the backing element 12 is mounted in the carriage 18 and aligned along the rigid plate portion 63. The rigid plate portion 63 may include a recess sized to closely receive the backing element 12 therein. The cable 14 is then located in front of the backing element 12 (see FIG. 1A) such that each contact 32 of the cable 14 is aligned with a contact protrusion 40 of the backing element 12. For example, each contact protrusion 40 may be shaped and located to engage the backside 31 of the cable 14 immediately opposite one of the contacts 32. The cable 14, backing element 12 and/or carriage 18 may include various mechanical alignment features to ensure alignment of the cable 14 relative to the backing element 12. Once the cable 14 and backing element 12 are properly aligned, the printhead 16 can be placed into the carriage 18 such that each contact point 22, 24 is aligned with one of the contacts 32 of the cable 14. FIG. 9 illustrates the connection module in its aligned, uncompressed condition. Each of the set of upper 50 or lower 52 contact protrusions is shaped and located to correspond to a contact 32 on the cable 14, and each contact 32 is shaped and located to engage one of the contact points 22, 24 of the printhead 16 or ink tanks.

The entire assembly or connection module 10 of the cable 14, printhead 16, and backing element 12 is then pressed together, such as by pivoting the retaining arm 19 to its closed position. This urges the backing element 12, cable 14 and printhead 16 against the plate portion 63 of the carriage 18 and into contact with each other. As the backing element 12, cable 14 and printhead 16 are pressed together, each contact protrusion 40 engages the backside 31 of the cable 14 adjacent to a contact 32, and presses each contact 32 into engagement, or contact, with an associated contact point 22, 24 such that each contact 32 is electrically coupled to a contact point 22, 24 (see FIG. 10).

Figure 10:
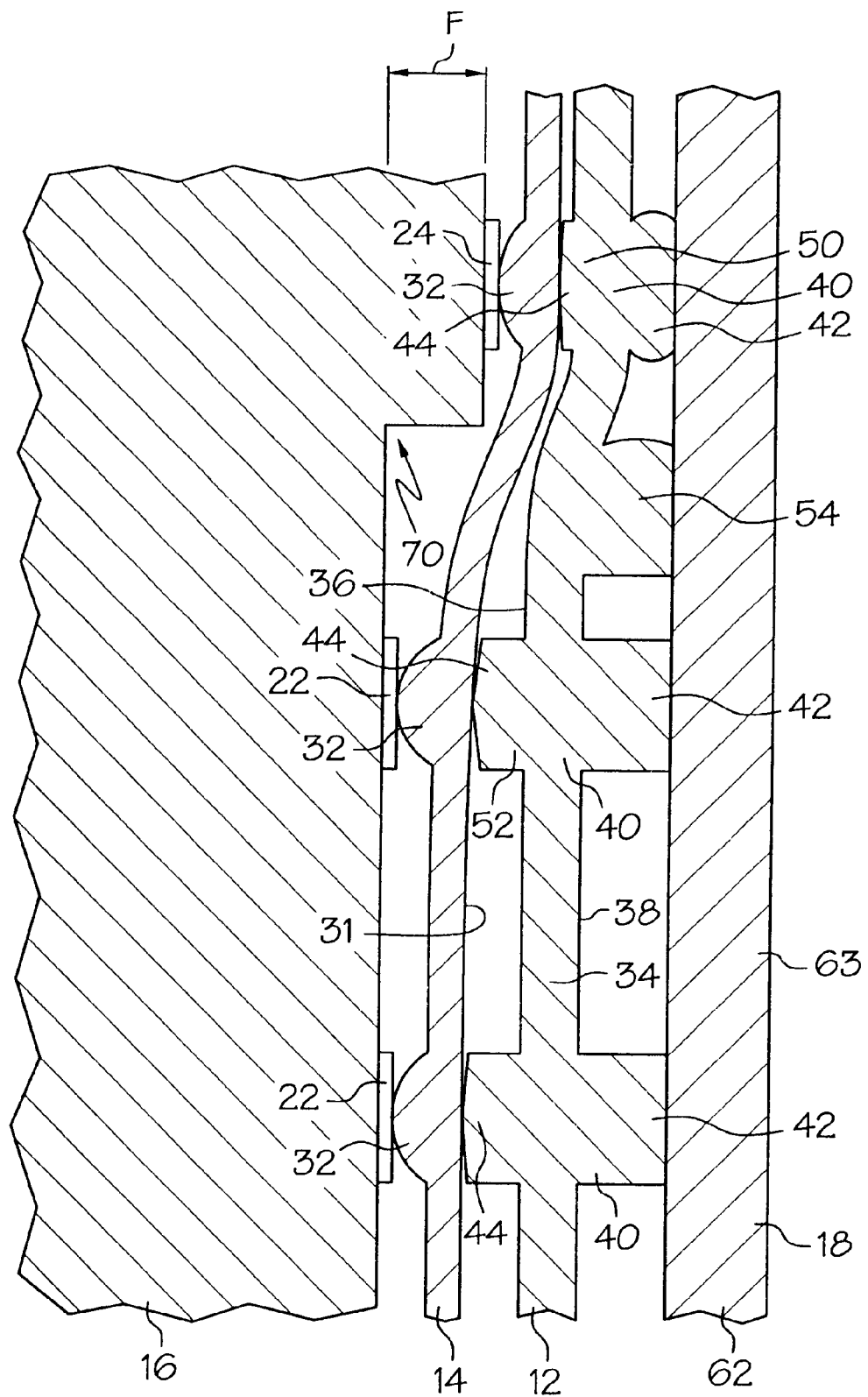
FIG. 10 is a side cross section of the connection module of FIG. 9, shown in its clamped condition.

When the connection module of FIG. 9 is compressed, as shown in FIG. 10, the contacts 32 are urged into contact with the contact points 22, 24, and the rib 54 provides stiffness to the piece of sheet-like 34 material adjacent to the junction 70 between the printhead contact points 22 and ink tank contact points 24. In other words, when the connection module of FIG. 10 is formed, the rib 54 is preferably located at the same horizontal position as the junction 70. In this manner, the rib 54 provides stiffness to the backing element 12 to ensure that the upper 50 and lower 52 contact protrusions located adjacent to the rib 54 contact the cable 12, and urge the associated contacts 32 into engagement with the associated contact points 22, 24.

After the connection module of FIG. 10 is formed, the wires 30 of the cable 14 are thereby electrically coupled to the printhead 16. As noted earlier, the cable 14 may in turn be connected to a controller for controlling the carriage and printhead 16. In this manner, when the connection module of FIG. 10 is created, the controller is connected to the printhead 16, and can thereby control ejection of ink from the printhead 16 and monitor the level of ink in the ink tanks 20.

Figure 11:
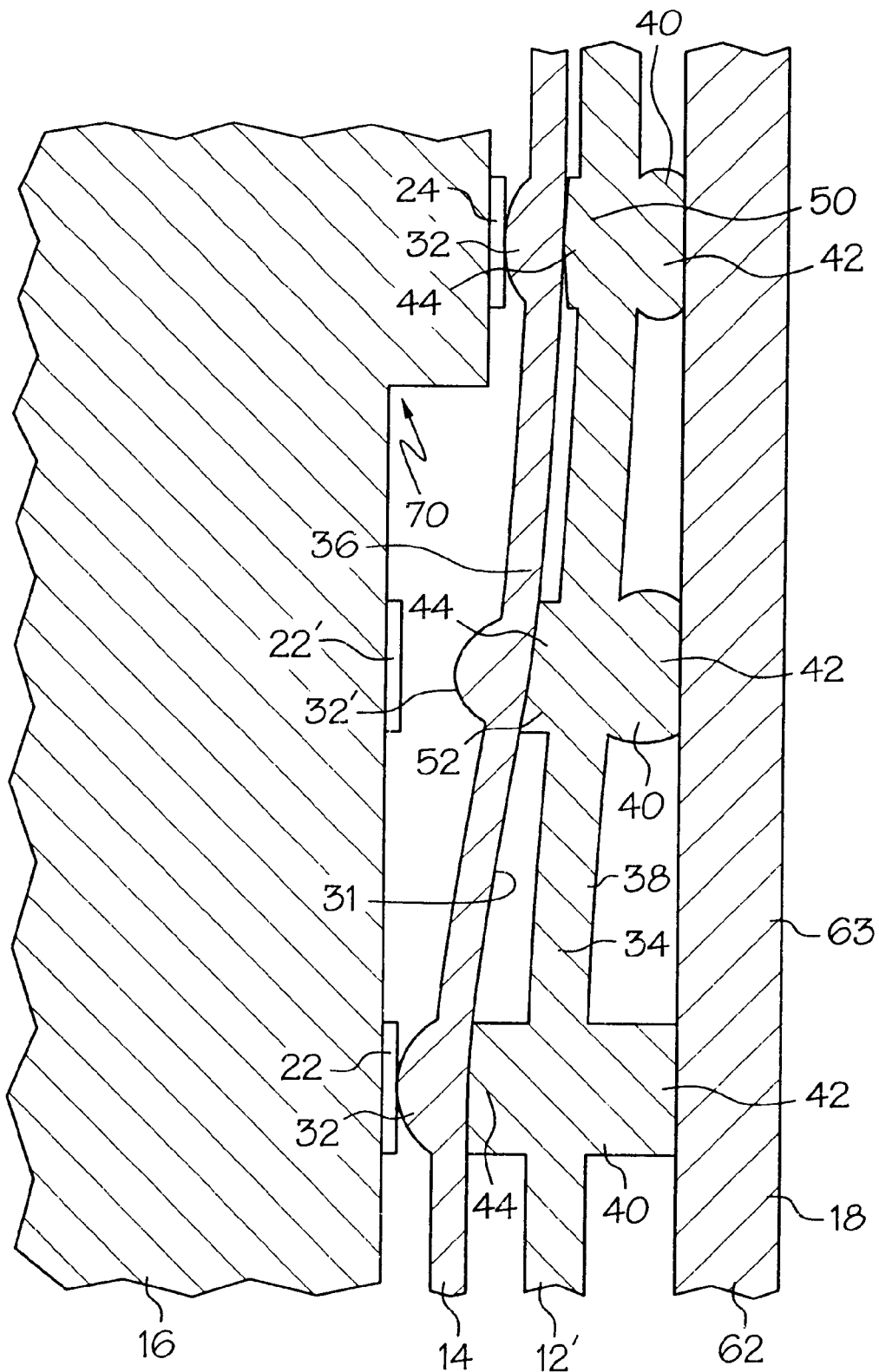
FIG. 11 is a detail side cross section of a connection module using a backing element without a rib.

FIG. 11 illustrates a connection module with a backing element 12' which lacks the rib 54 of the backing element 12 of FIGS. 6–8. In this case, the forwardly extending portions 44 of the contact protrusions 40 location adjacent to the junction 70 are compressed, and the backing element 12 lacks the stiffness contributed by the rib 54 to resist the compression. In this case, the non-co-planar nature of the contact points 22, 24 causes the cable 14 to be pulled away from the contact points adjacent to the junction 70. For example the contact 32' may be spaced away from the contact point 22'. In this case, the cable 14 does not make good contact with the printhead 16 which can result in poor connections and adversely affect print quality or printhead functions. In contrast, as shown in FIG. 10, the rib 54 of the backing element 12 lends stiffness to the backing element 12 adjacent to the junction 70 and limits deflection of the backing element 12. Thus, nearly any structure or materials that add stiffness to the backing element 12 at the desired location may be used without departing from the scope of the invention, such as strips or portions of plastic, metal, ribs, or any other structure or material that enables the contact protrusions 40 located adjacent to the junction 70 to press the associated contact 32 into engagement with a contact point 22, 24.

Furthermore, the backing element 12 may include a flat back surface and have protrusions that extend only forwardly from the piece of material 34. For example, the backing element 12 may include the piece of material 34 and in this case the contract protrusions 40, stiffening element 54 and outer lip 60 (if any) may extend from only the front side 36 of the piece of material 34. In this case the piece of material 34 includes a back side 38 which is pressed flat against the plate portion 63 of the carriage 18. Furthermore, it should be understood that any one or all of the contact protrusions 40, stiffening element 54, and outer lip 60 may extend from only one of the front side 36 or rear side 38 of the sheet of material 34.

Figure 12:
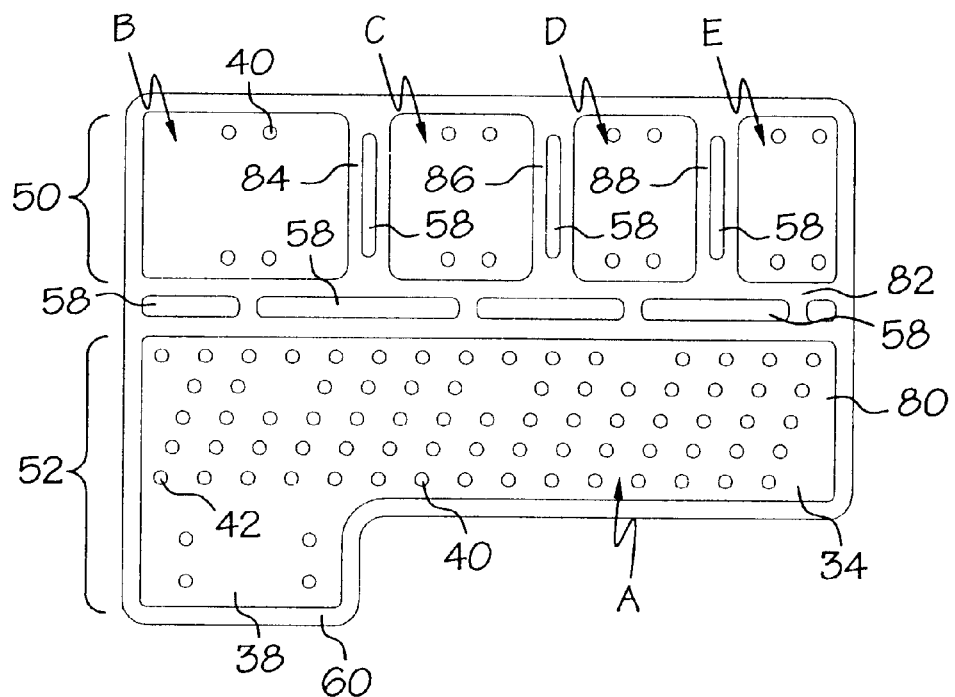
FIG. 12 is a rear view of an alternate embodiment of the backing element of the present invention.

FIG. 7 illustrates one embodiment of the invention wherein the rib 54 extends between the upper 50 and lower 52 sets of contact protrusions. However, the rib or ribs 54 can be located at nearly any position where it is expected that the corresponding contact points may not be co-planar. Because each individual ink tank 20 may not be co-planar with the other ink tanks, the ink tank contacts 24 of the differing ink tanks 20 may therefore be non-co-planar. For example, in FIG. 4, each set of ink tank contacts 90, 92, 94, 96 may be non-co-planar. Thus, in the embodiment of FIG. 12 the backing element 80 includes a horizontally extending rib 82 that corresponds to the rib 54 of the embodiment of FIG. 7. However, the backing element 80 also includes a set of generally vertically-extending ribs 84, 86, 88, each rib 82, 84, 86, 88 having a recess 58 formed therein. The ribs 84, 86, 88 of the backing element 80 of FIG. 12 ensure that each upper contact protrusion 50 urges its associated contact 32 into contact with the associated contact point 24. In other words, the ribs 82, 84, 86, 88 are each located at a junction of potential non-planarity. The ribs 82, 84, 86, 88 also divide the backing element 12 into five zones A, B, C, D and E. Each of the five zones can individually move out of a plane of the other four zones, which enables the contact protrusions 40 in each zone to urge an associated contact 32 into engagement with a point 24 that is not necessarily co-planar with the points 22, 24 corresponding to the other zones.

Thus, a rib 54 or other stiffening element can be located to correspond to any point or line where a planar discontinuity in the points 22, 24 may be anticipated. For example, in an extreme but potentially desirable example, each contact protrusion 40 may be surrounded or "boxed-in" by a set of ribs in order to account for separate non-planarity of each point 22, 24. Thus, various shapes and arrangements of ribs can be located on the backing element 12 as desired to match the ribs to the areas or junctions of potential non-planarity of the printhead 16. However, the ribs may also be located where it is not anticipated that any non-planarity of the points may exist. Because the ribs or stiffening elements 54 increase the stiffness and improve the connections between the contacts 32 and the points 22, 24, the stiffening element or elements can be located at any position where it is desired to improve the connections, regardless of planarity or non-planarity of the points.

Figure 14:
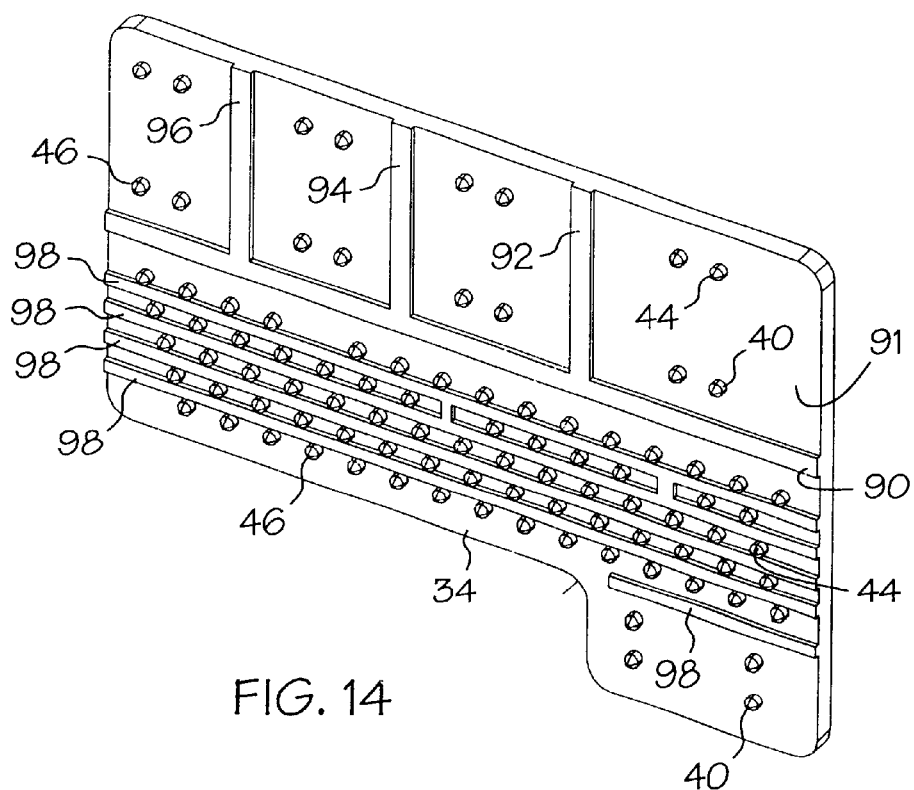
FIG. 14 is a front perspective view of the rubber backer of FIG. 13.
Figure 13:
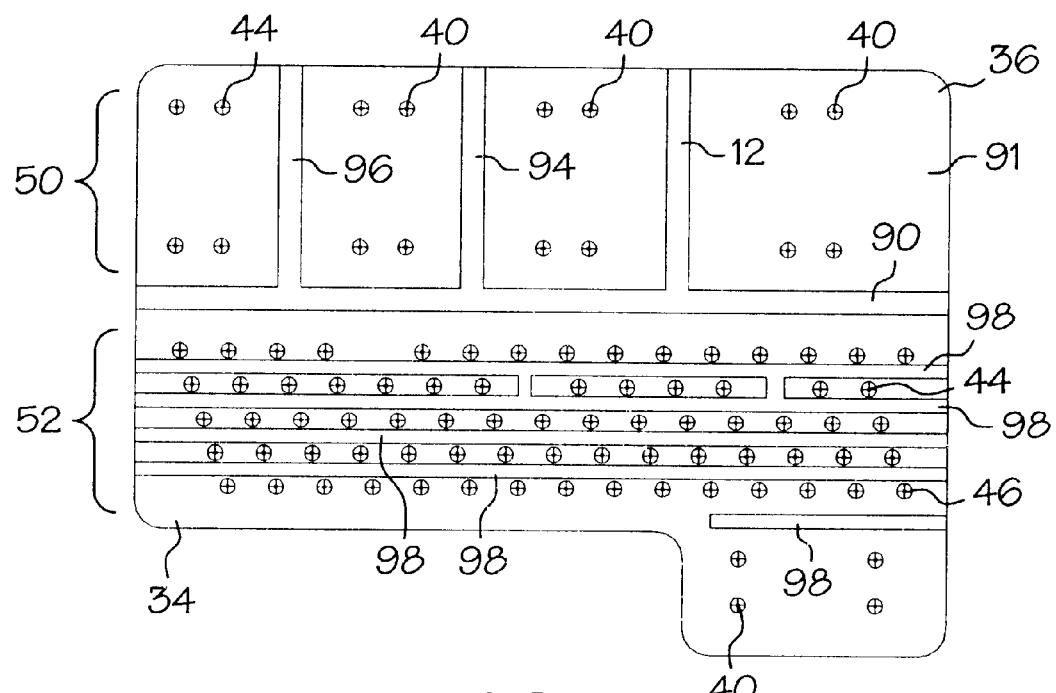
FIG. 13 is a front view of another alternate embodiment of the backing element of the present invention.
Figure 15:
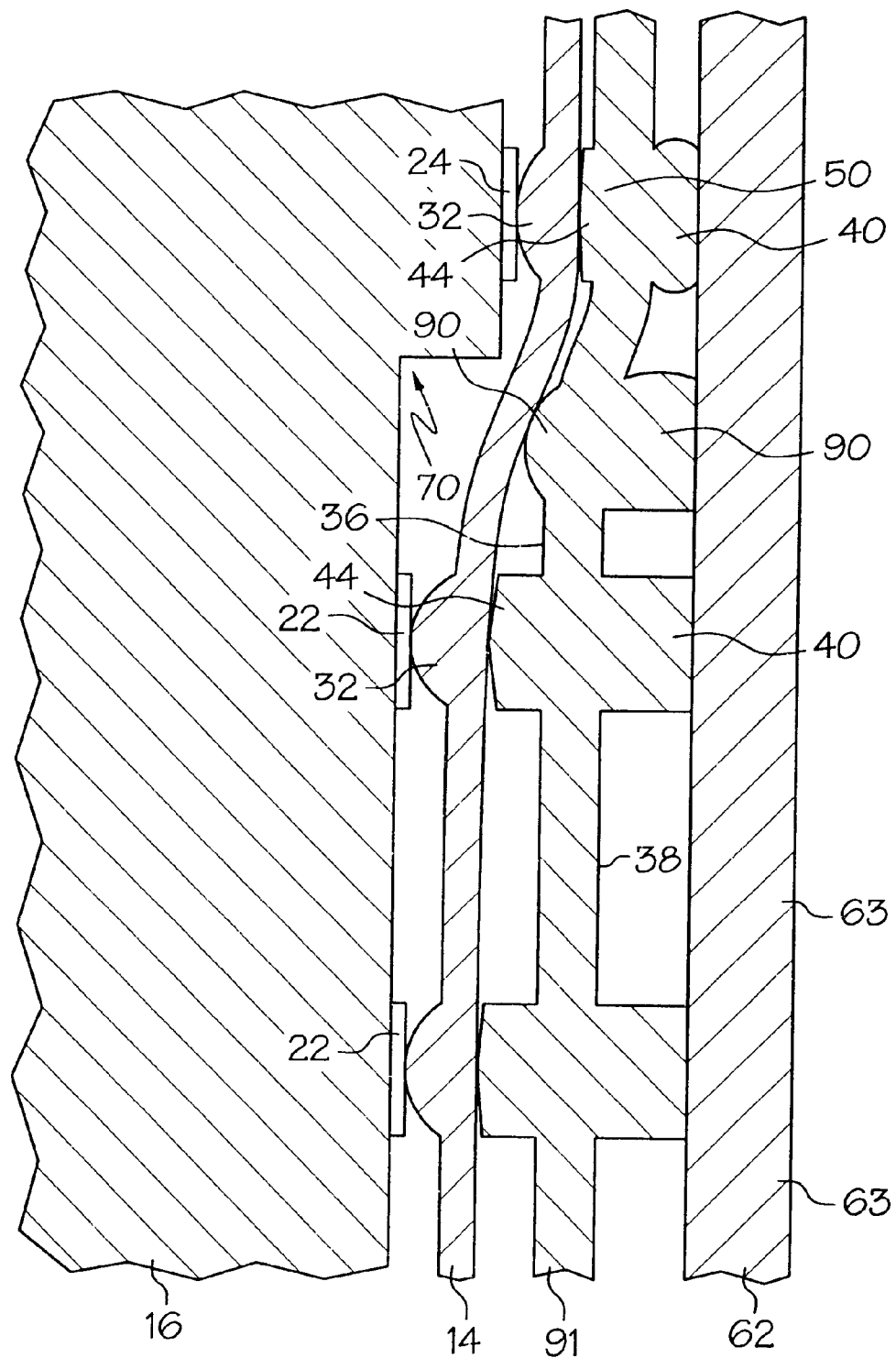
FIG. 15 is a detail side cross section of a connection module using the backing element of FIG. 13.

The rib or ribs 54 may also be located on only the front side 36 of the backing element 12, only on the rear side 38, or on both the front and rear sides 36, 38. For example, FIGS. 13–15 illustrate a backing element 91 having a set of ribs 90, 92, 94, 96, 98 that extend both forwardly and rearwardly from the backing element 91. Furthermore, in this embodiment the ribs 98 run laterally between each row of the lower contact protrusions 52.

When a connection module is assembled using the backing element 91 of FIGS. 13 and 14, as shown in FIG. 15, the rib 90 located adjacent to the junction 70 engages the cable 14 and blocks the cable 14 from being moved rearwardly. In this manner the rib 90 ensures that each contact 32 located adjacent to the rib 90 remains in engagement with the adjacent contact point 22, 24.

The compliant nature of the backing element 12 of the present invention, along with the ribs, enables the backing element 12 to conform to different planes and increases the robustness of the resultant electrical connection system. As noted earlier this feature can be especially useful for use with printheads that have disposable ink tanks with contact points that need to make electrical connection with a plane of contacts on a cable. The plane of contact may be vertical, horizontal, or nearly any other configuration. Thus, for example, the terms "forwardly" and "rearwardly" as used herein includes any planes that are non-co-planar, regardless of the actual orientation of such planes. Furthermore, the terms "horizontal" and "vertical" as used herein are for illustrative and descriptive purposes only, and are not intended to limit the orientation of the system of the present invention.

It has been found that during manufacturing or assembly, the tolerances for locating the ink tank contact points 24 are usually greater than the tolerance associated with locating the printhead contact points 22. Therefore, it has been found that it may be desirable to position the ink tank contact points 24 forwardly of the printhead contact points 22 (that is, it may be desirable to position the ink tank contact points 24 closer to the printhead cable 14, as illustrated in FIG. 9)

to ensure that electrical contact with the printheads 20 is maintained, as will be discussed below.

Figure 17:
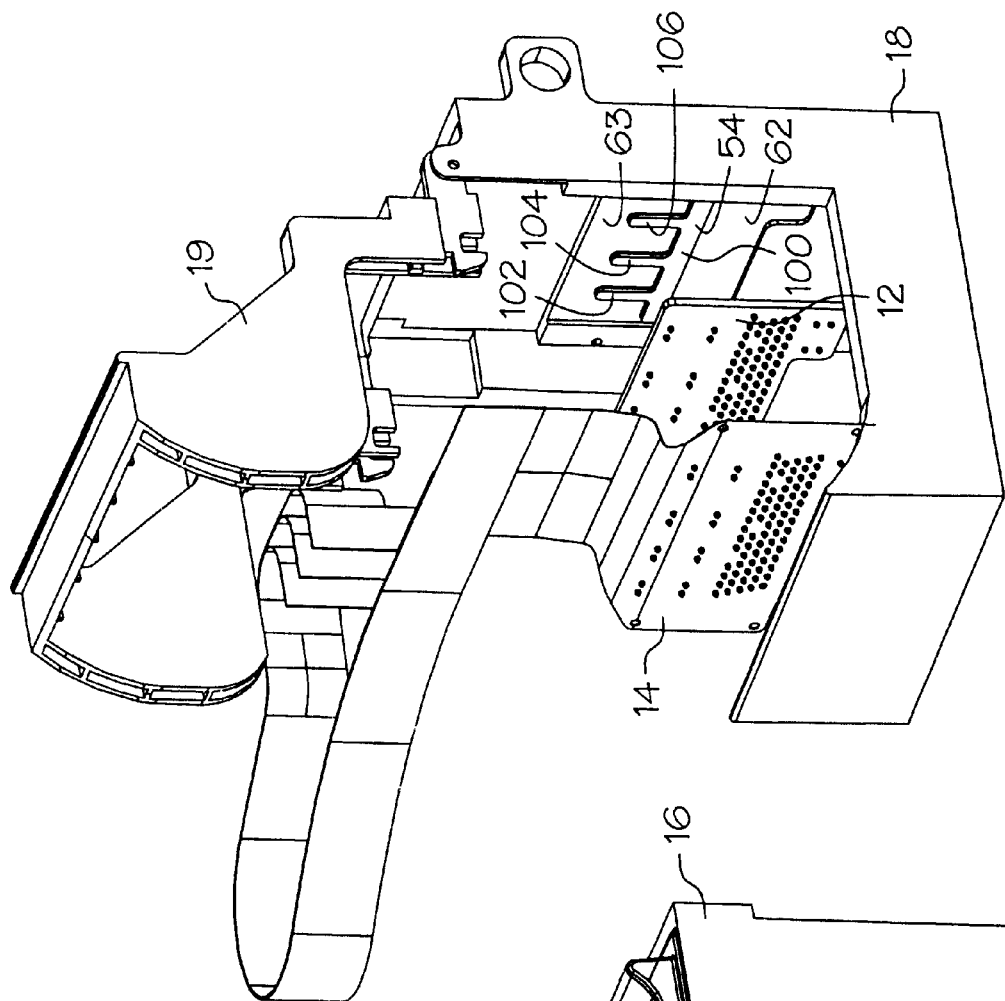
FIG. 17 is a front perspective exploded view of a carriage, printhead cable and backing element.
Figure 17:
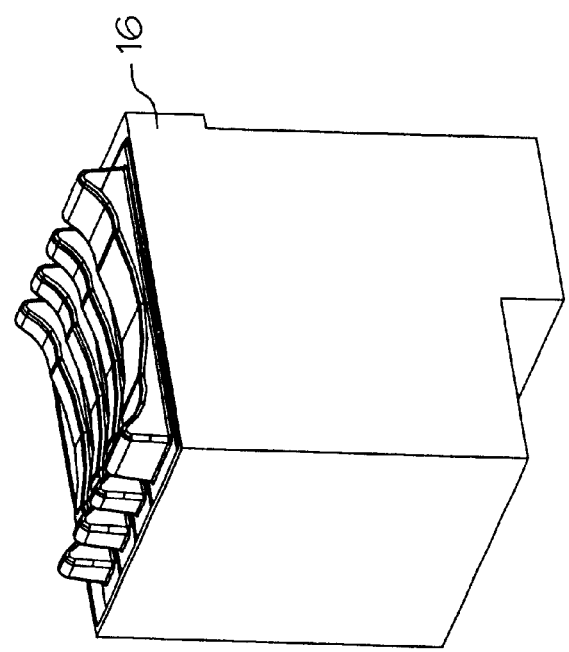

Furthermore, the stiffening element 54 need not be coupled to the piece of sheet-like material 34, and can be located on nearly any component where the stiffening element provides the desired result. For example, in one embodiment, as illustrated in FIG. 17, the stiffening element 54 is located on the plate portion 63 of the carriage 18. In this case the stiffening element 54 includes a horizontally extending portion 100 and a set of vertically-extending portions 102, 104, 106. In this embodiment, when the backing element 12 is pressed against the plate portion 63 and the stiffening element 54, the backing element has characteristics and performance similar to the backing element 80 of FIG. 12. The stiffening element 54 could also be located on the cable 14. The stiffening element could also be a separate component that is separately mounted into the connection module and, for example, could be "sandwiched" in place (i.e, frictionally held) between the backing element 12 and plate portion 63.

Figure 16:
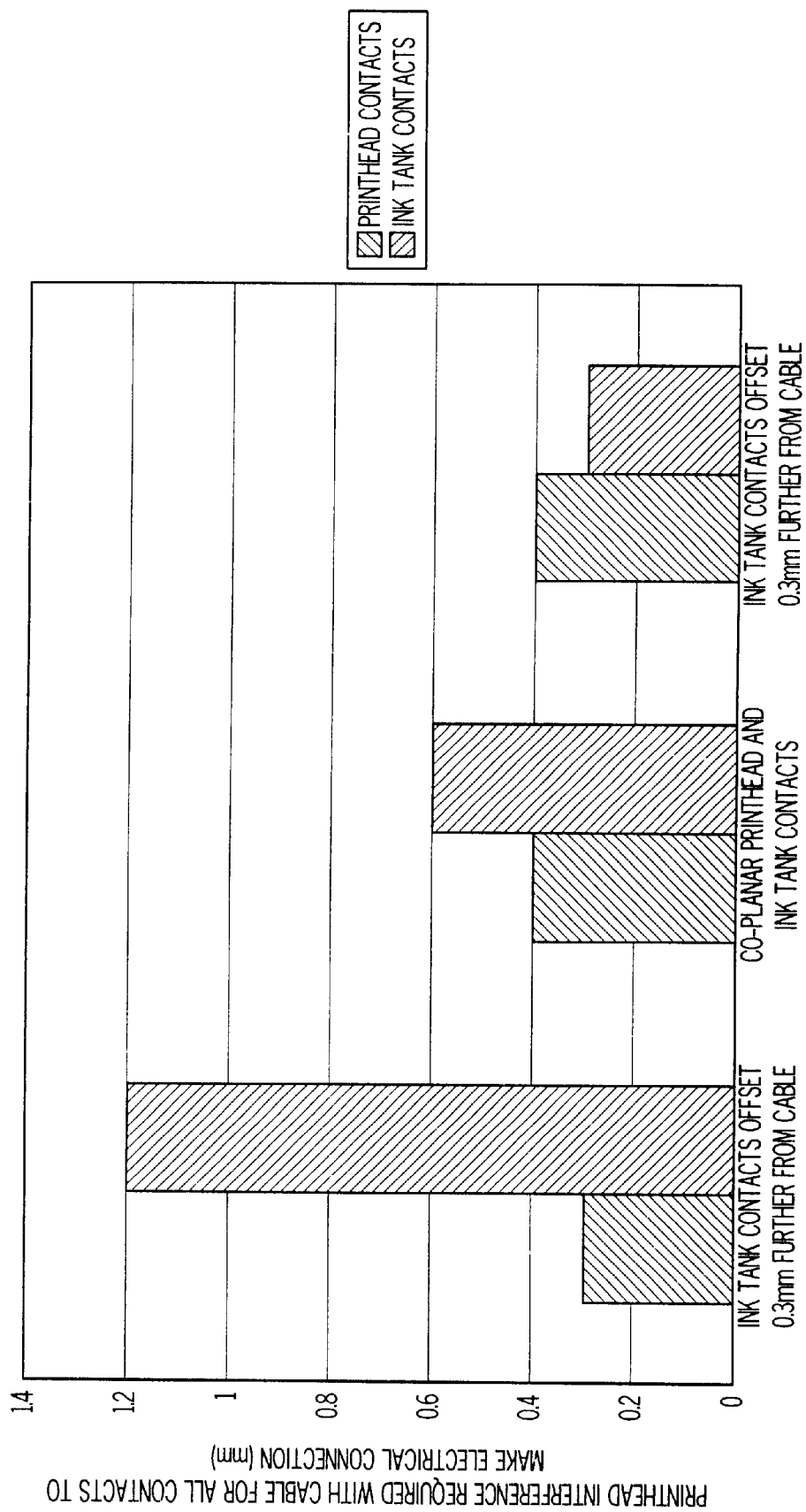
FIG. 16 is a graph illustrating the effects of offsetting the ink tank contacts relative to the printhead contacts.

FIG. 16 is a graph illustrating the effects of offsetting the ink tank contact points 24 relative to the printhead contact point 22. The vertical axis represents the amount of "interference" or distance the backing element 12, cable 14, and printhead must be pressed together or compressed beyond their uncompressed state until all the contacts 32 of the cable 14 make an electrical connection with an associated contact point 22, 24 of the printhead 16 or ink tank 20. In other words the vertical axis represents the distance (in mm) that the connection module must be compressed in order for each of the contacts 32 of the cable 14 to contact a corresponding contact point 22, 24 on the printhead 16 or ink tank 20. Although the vertical axis represents a distance, the vertical axis is proportional to the applied compression force.

The left-most pair of bars represents the data when the printhead contact points 22 are offset from ink tank contact points 24 by 0.3 mm (i.e. the printhead contact points 22 are located 0.3 mm closer to the cable 14 than the ink tank contact points 24). As can be seen from the graph, in this configuration about 0.3 mm of interference is required to urge all the printhead contact points 22 into contact with the corresponding contacts 32 of the cable 14, and 1.2 mm of interference is required to urge all the ink tank contacts 24 into contact with the corresponding contacts 32 of the cable 14.

The center set of bars represent the condition when the printhead contact points 22 are co-planar with the ink tank contact points 24. In this set of data, the ink tank contact points 24 have remained in the same position as the left-most set of bars, but the printhead contact points 22 are moved such that they are co-planar with the ink tank contact points. Finally, the right-most set of bars represents the condition when the printhead contact points 22 are located rearwardly of the ink tank contacts 24 (further from the cable 14) by 0.3 mm (for example, the condition illustrated in FIG. 9)

As can be seen in the graph of FIG. 16, offsetting the ink tank contact points 24 relative to the printhead contact points 22 has little effect on the interference required to make electrical connection with the printhead contact points 22. In contrast, offsetting of the ink tank contact points 24 significantly affects the interference required to make contact with the ink tank contact points 24.

Accordingly, it can be seen from the graph of FIG. 16 that the lowest interference required to ensure contact for both the printhead contact points 22 and the ink tank contact points 24 in the illustrated arrangements is illustrated in the right-most pair of bars. In this arrangement the ink tank contact points 24 are located ahead of the printhead contact points 22 by about 0.3 mm, and therefore it may be desirable to locate the ink tank contact points 24 in front of the printhead contact points 22. In one embodiment, it has been found that it is optimal to locate the ink tank contact points 24 about 0.15 mm forwardly of the printhead contact points 22. Furthermore, the compliant backing element 12 of the present invention can be used to ensure that all electrical connections between the cable 14 and the ink tank contact points 24 and printhead contact points 22 remain secure, even when the ink tank contact points 24 are not co-planar with the printhead contact points 22. However, it should be understood that the stiffening element 54 and backing element of the present invention can be used in any connection system, even when the contact points are all co-planar, to improve the connections between the various components.

Having described the invention in detail and by reference to the preferred embodiments, it will be apparent that modifications and variations thereof are possible without departing from the scope of the invention.

What is claimed is:

1. A connection module comprising:
   a base including a set of points;
   a cable including a plurality of contacts located thereon, each contact being shaped and located to engage one of said points;
   a backing element including a piece of sheet-like material and having a set of contact protrusions extending generally outwardly from said piece of sheet-like material, each of said contact protrusions being shaped and located to engage said cable and urge one of said contacts into engagement with one of said points; and
   a stiffening element located adjacent to selected ones of said contact protrusions to ensure said selected contact protrusions engage said cable to urge the associated contacts into engagement with the associated points, wherein a line generally perpendicular to the backing element and passing through one of the points and passing through the contact which is shaped and located to engage the one point is spaced apart from the stiffening element, and wherein a line generally perpendicular to the backing element and passing through the stiffening element is disposed between, and spaced apart from, two lines generally perpendicular to the backing element and passing one each through two adjacent ones of the contact protrusions.

2. The connection module of claim 1 wherein said base includes a first set of points in a first plane and a second set of points in a second plane defining a junction therebetween, and wherein said stiffening element is located on said piece of sheet-like material and generally aligned with said junction.

3. The connection module of claim 1 further comprising a carriage receiving said backing element, said base, and at least part of said cable therein, and wherein said stiffening element is located on said carriage.

4. The connection module of claim 1 wherein said stiffening element is located on said cable.

5. The connection module of claim 1 wherein said stiffening element is a separate stand-alone component and is separable from said base, said cable and said backing element.

6. The connection module of claim 1 further comprising a carriage shaped to receive said printhead, said backing element and at least part of said cable therein, and wherein said stiffening element is located on a rear surface of said carriage and adjacent to said backing element.

7. A connection module comprising:
a base including a forward set of points located in a forward plane and a rearward set of points located in a rearward plane, said forward and rearward planes defining a junction therebetween wherein said forward and rearward planes are in two different planes;
a cable including a plurality of contacts located thereon, each contact being shaped and located to engage one of said points;
a backing element including a piece of sheet-like material having a set of contact protrusions located thereon, each of said contact protrusions being shaped and located to engage said cable and urge one of said contacts into engagement with one of said points; and
a stiffening element located adjacent to selected ones of said contact protrusions and generally aligned with said junction to ensure that said selected contact protrusions engage said cable to urge the associated contacts into engagement with the associated points.

8. The connection module of claim 7 wherein said stiffening element is located on said backing element.

9. The connection module of claim 7 wherein said cable is located between said base and said backing element, and wherein said stiffening element is located to ensure that said contact protrusions located adjacent to said stiffening element contact said cable and urge the associated contacts into engagement with one of said points.

10. The connection module of claim 9 further comprising a stiffening plate located adjacent said backing element, and wherein said stiffening element is located on said stiffening plate.

11. The connection module of claim 7 wherein each point and each contact are made of conductive material.

12. The connection module of claim 7 wherein said base is a printhead for use in a printer and said cable is a flexible connecting cable.

13. The connection module of claim 12 further comprising a carriage shaped to receive said printhead, said backing element and at least part of said cable therein.

14. The connection module of claim 13 wherein said carriage includes a biasing mechanism for urging said backing element into contact with said cable and said cable into contact with said base.

15. The connection module of claim 13 wherein said carriage is laterally movable to move said printhead along various locations of a sheet of media received in said printer.

16. The connection module of claim 7 wherein said set of contact protrusions includes a first and second set of contact protrusions, and wherein each of said first set of contact protrusions is shaped and located to urge a contact of said cable into contact with one of said forward set of points and wherein each of said second set of contact protrusions is shaped and located to urge a contact of said cable into contact with one of said rearward set of points, and wherein said stiffening element extends generally between said first and second set of contact protrusions.

17. The connection module of claim 7 wherein said stiffening element is a rib-shaped support protrusion.

18. The connection module of claim 17 wherein each contact protrusion extends generally forwardly and rearwardly from said piece of sheet-like material, and wherein said support protrusion extends generally rearwardly from said piece of sheet-like material.

19. The connection module of claim 18 wherein each contact protrusion and each support protrusion extend about the same distance generally rearwardly from said piece of sheet-like material.

20. The connection module of claim 7 wherein each contact protrusion extends generally forwardly and rearwardly from said piece of sheet-like material, and wherein said support protrusion extends generally forwardly from said piece of sheet-like material.

21. The connection module of claim 7 wherein said piece of sheet-like material is rubber.

22. The connection module of claim 7 wherein each contact protrusion includes a forwardly extending portion extending generally forwardly from said piece of sheet-like material and rearwardly extending portion extending generally rearwardly from said piece of sheet-like material, said forwardly and rearwardly extending portions of each contact protrusion being generally cylindrical.

23. The connection module of claim 22 wherein each forwardly-extending portion of each contact protrusion includes a generally conical tip.

24. The connection module of claim 7 wherein said backing element is flexible.

25. The connection module of claim 7 wherein said contacts are located on a forward side of said cable and wherein each contact protrusion engages a back side of said cable.

26. The connection module of claim 7 wherein said stiffening element includes a plurality of protrusions.

27. The connection of claim 26 wherein said plurality of protrusions are generally linearly aligned.

28. The connection module of claim 7 wherein said stiffening element is a separate stand-alone component and is separable from said base, said cable and said backing element.

29. A connection module comprising:
a base including a forward set of points located in a forward plane and a rearward set of points located in a rearward plane, said forward and rearward planes defining a junction therebetween wherein said forward and rearward planes are in two different planes;
a cable including a plurality of contacts located thereon, each contact being shaped and located to engage one of said points; and
a backing element including a piece of sheet-like material, a first and second set of protrusions on said piece of material, each of said protrusions being shaped and located to engage said cable adjacent to one of said contacts and urge said contact into engagement with one of said points, said backing element further including a stiffening element extending between said first set of protrusions and said second set of protrusions, said stiffening element being located to ensure that said first or second protrusions located adjacent to said stiffening element contact said cable and urge the associated contacts into engagement with one of said points.

30. A backing element for contacting a cable having a plurality of contacts thereon and causing each contact to engage a point, the backing element comprising:
a piece of sheet-like material;
a set of contact protrusions each extending generally outwardly from said piece of sheet-like material; and
a stiffening element located on said piece of sheet-like material and being shaped and located to ensure that any contact protrusions located adjacent to said stiffening element contact said cable and urge the associated contacts into engagement with one of said points, wherein a line generally perpendicular to the backing element and passing through one of the points and passing through the contact caused to engage the one point is spaced apart from the stiffening element, and wherein a line generally perpendicular to the backing element and passing through the stiffening element is disposed between, and spaced apart from, two lines generally perpendicular to the backing element and passing one each through two adjacent ones of the contact protrusions.

31. The backing element of claim 30 wherein said stiffening element divides said set of contact protrusions into a first set and a second set of contact protrusions.

32. The backing element of claim 30 said stiffening element is a rib-shaped protrusion.

33. The backing element of claim 30 wherein said stiffening element extends generally rearwardly from said piece of sheet-like material.

34. The backing element of claim 33 wherein each contact protrusion includes a forwardly extending portion extending generally forwardly from said piece of sheet-like material and rearwardly extending portion extending generally rearwardly from said piece of sheet-like material, said forwardly and rearwardly extending portions of each contact protrusion being generally cylindrical.

35. The backing element of claim 30 wherein said backing element is flexible.

36. The backing element of claim 30 further comprising an auxiliary stiffening element located on said piece of sheet-like material and being shaped and located to ensure that any contact protrusions located adjacent to said auxiliary stiffening element contact said cable and urge the associated contacts into engagement with one of said points.

37. A method for completing a connection comprising the steps of:

providing a base including a forward set of points located in a forward plane and a rearward set of points located in a rearward plane, said forward and rearward planes defining a junction therebetween wherein said forward and rearward planes are in two different planes;

providing a cable including a plurality of contacts located thereon;

providing a backing element including a piece of sheet-like material, a set of contact protrusions on said piece of material, and at least one stiffening element on said piece of material;

aligning said base, said cable and said backing element such that each contact is aligned with one of said points, each contact protrusion is aligned with one of said contacts, and said stiffening element is aligned with said junction; and compressing said base, said cable and said backing element together such that each contact protrusion urges one of said contacts into engagement with one of said points.

* * * * *